United States Patent
Ko et al.

(10) Patent No.: US 11,482,592 B2
(45) Date of Patent: Oct. 25, 2022

(54) SUBSTRATE AND MANUFACTURING METHOD THEREOF AND ELECTRONIC DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Minho Ko, Beijing (CN); Wanli Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 442 days.

(21) Appl. No.: 16/471,336

(22) PCT Filed: Oct. 26, 2018

(86) PCT No.: PCT/CN2018/112199
§ 371 (c)(1),
(2) Date: Jun. 19, 2019

(87) PCT Pub. No.: WO2019/184327
PCT Pub. Date: Oct. 3, 2019

(65) Prior Publication Data
US 2021/0359077 A1 Nov. 18, 2021

(30) Foreign Application Priority Data
Mar. 30, 2018 (CN) .......................... 201810293281.2

(51) Int. Cl.
*H01L 27/32* (2006.01)
*H01L 21/768* (2006.01)
(Continued)

(52) U.S. Cl.
CPC ........ *H01L 27/3279* (2013.01); *H01L 21/768* (2013.01); *H01L 23/5226* (2013.01); *H01L 23/60* (2013.01)

(58) Field of Classification Search
CPC ..... H01L 23/66; H01L 23/31; H01L 23/5386; H01L 23/3121; H01L 21/56; H01L 25/0655; H01Q 1/2283
(Continued)

(56) References Cited

U.S. PATENT DOCUMENTS 7,291,970 B2 11/2007 Kuwabara
7,851,996 B2 * 12/2010 Nakamura .......... H01L 27/3279
313/506
(Continued)

FOREIGN PATENT DOCUMENTS

CN 1668152 A 9/2005
CN 1967866 A 5/2007
(Continued)

OTHER PUBLICATIONS

International Search Report and Written Opinion dated Jan. 30, 2019; PCT/CN2018/112199.
(Continued)

*Primary Examiner* — Dao H Nguyen

(57) ABSTRACT

A substrate, a manufacturing method of a substrate and an electronic device are provided. The substrate includes a working region, a non-working region surrounding the working region, a base substrate, a peripheral circuit and a common electrode lead both in the non-working region and on the substrate; the common electrode lead is located on a side of the peripheral circuit close to the working region.

18 Claims, 9 Drawing Sheets

(51) Int. Cl.
*H01L 23/522* (2006.01)
*H01L 23/60* (2006.01)

(58) Field of Classification Search
USPC .................................................. 257/659
See application file for complete search history.

(56) References Cited

U.S. PATENT DOCUMENTS

| | | | |
|---|---|---|---|
| 7,923,926 B2 | 4/2011 | Terada et al. | |
| 7,929,038 B2 | 4/2011 | Nakamura et al. | |
| 7,994,711 B2 | 8/2011 | Nakamura et al. | |
| 8,247,968 B2 | 8/2012 | Kwak et al. | |
| 8,785,949 B2 | 7/2014 | Yamazaki et al. | |
| 9,000,428 B2* | 4/2015 | Lee | H01L 27/3272 257/40 |
| 9,098,132 B2 | 8/2015 | Shim et al. | |
| 9,478,598 B2 | 10/2016 | Ono et al. | |
| 9,960,222 B2 | 5/2018 | Gai et al. | |
| 10,031,393 B2 | 7/2018 | Li et al. | |
| 10,096,795 B2 | 10/2018 | Murakami et al. | |
| 10,600,854 B2* | 3/2020 | Kim | H01L 27/3276 |
| 10,714,550 B2 | 7/2020 | Kim et al. | |
| 2014/0284591 A1 | 9/2014 | Ono et al. | |
| 2014/0332769 A1 | 11/2014 | Lee et al. | |
| 2015/0228927 A1* | 8/2015 | Kim | H01L 27/3276 257/40 |
| 2016/0141545 A1 | 5/2016 | Kim | |
| 2017/0278912 A1* | 9/2017 | Kim | H01L 27/3276 |
| 2017/0287995 A1 | 10/2017 | Kim et al. | |
| 2017/0330921 A1 | 11/2017 | Lee et al. | |
| 2018/0090700 A1 | 3/2018 | Nishinohara et al. | |
| 2018/0151831 A1* | 5/2018 | Lee | H01L 27/3258 |

FOREIGN PATENT DOCUMENTS

| | | |
|---|---|---|
| CN | 1983623 A | 6/2007 |
| CN | 103365009 A | 10/2013 |
| CN | 103918098 A | 7/2014 |
| CN | 104716165 A | 6/2015 |
| CN | 104965367 A | 10/2015 |
| CN | 105895637 A | 8/2016 |
| CN | 106775173 A | 5/2017 |
| CN | 107230695 A | 10/2017 |
| JP | 2004047411 A | 2/2004 |
| JP | 2004127933 A | 4/2004 |
| JP | 2006113568 A | 4/2006 |
| JP | 2007073499 A | 3/2007 |
| JP | 2008203761 A | 9/2008 |
| KR | 1020150033790 A | 4/2015 |
| WO | 2007/066573 A | 6/2007 |

OTHER PUBLICATIONS

The Second Chinese Office Action dated Jul. 16, 2021; Appln. No. 201810293281.2.
The First Chinese Office Action dated Jan. 21, 2021; Appln. No. 201810293281.2.
The Extended European Search Report dated Jan. 5, 2022; Appln. No. 18887217.0.
First Japanese Office Action dated Aug. 22, 2022; Appln. No. 2019-547303.

* cited by examiner

SUBSTRATE AND MANUFACTURING METHOD THEREOF AND ELECTRONIC DEVICE

The present application claims the priority of the Chinese Patent Application No. 201810293281.2 filed on Mar. 30, 2018, the entire disclosure of which is incorporated herein by reference as a part of the present application.

TECHNICAL FIELD

Embodiments of the present disclosure relate to a substrate, a manufacturing method of a substrate, and an electronic device.

BACKGROUND

In a display substrate, a larger resistance in a connection line of a circuit (for example, a driving circuit) causes the signal transmission speed in the circuit to slow down, which results in uneven brightness of a display screen and affects the display quality. In addition, with the development of display technology, people have increasingly requirement for a display substrate with a narrow frame.

SUMMARY

At least one embodiment of the present disclosure provides a substrate, and the substrate comprises: a working region and a non-working region surrounding the working region; a base substrate; a peripheral circuit and a common electrode lead both in the non-working region and on the base substrate; in which the common electrode lead is located on a side of the peripheral circuit close to the working region.

For example, the substrate provided by at least one embodiment of the present disclosure further comprises a common electrode, and the common electrode extends from the working region to the non-working region; and the common electrode is in direct contact with at least a portion of the common electrode lead.

For example, in the substrate provided by at least one embodiment of the present disclosure, the peripheral circuit is a gate driving circuit, and the common electrode is a cathode, and the common electrode lead is a cathode lead.

For example, the substrate provided by at least one embodiment of the present disclosure further comprises a planarization layer covering both the peripheral circuit and the common electrode lead, and the common electrode is located on a side of the planarization layer away from the base substrate; the planarization layer comprises a via hole that exposes the at least a portion of the common electrode lead, and the common electrode is in direct contact with the common electrode lead at the via hole.

For example, the substrate provided by at least one embodiment of the present disclosure further comprises an electrostatic protective layer, and the electrostatic protective layer is disposed on a side of the planarization layer away from the base substrate and covers at least a portion of the peripheral circuit, and the electrostatic protective layer is electrically connected with the common electrode lead at the via hole.

For example, the substrate provided by at least one embodiment of the present disclosure further comprises a planarization layer, and the common electrode and the common electrode lead are disposed on a side of the planarization layer away from the base substrate, and the common electrode is in direct contact with the at least a portion of the common electrode lead.

For example, in the substrate provided by at least one embodiment of the present disclosure, the common electrode directly lies on the at least a portion of the common electrode lead to be in direct contact with the common electrode lead.

For example, in the substrate provided by at least one embodiment of the present disclosure, the common electrode lead directly lies on at least a portion of the common electrode to be in direct contact with the common electrode.

For example, in the substrate provided by at least one embodiment of the present disclosure, an end of the common electrode is abutted with an end of the common electrode lead, and the common electrode is in direct contact with the common electrode lead.

For example, in the substrate provided by at least one embodiment of the present disclosure, the working region comprises a plurality of working units arranged in an array, and each of the working units comprises: a first electrode, disposed on the base substrate; a functional layer, disposed on a side of the first electrode away from the base substrate; a second electrode, disposed on a side of the functional layer away from the base substrate; and the second electrode is the common electrode.

For example, in the substrate provided by at least one embodiment of the present disclosure, the common electrode lead is disposed in a same layer as the first electrode.

For example, the substrate provided by at least one embodiment of the present disclosure further comprises an electrostatic protective layer, and the electrostatic protective layer is disposed on a side of the planarization layer away from the base substrate and covers at least a portion of the peripheral circuit and is electrically connected with the common electrode lead.

For example, in the substrate provided by at least one embodiment of the present disclosure, the electrostatic protective layer directly lies on at least a portion of the common electrode lead to be in direct contact with the common electrode lead.

For example, in the substrate provided by at least one embodiment of the present disclosure, the common electrode lead directly lies on at least a portion of the electrostatic protective layer to be in direct contact with the electrostatic protective layer.

For example, in the substrate provided by at least one embodiment of the present disclosure, another end of the common electrode lead is abutted with an end of the electrostatic protective layer, and the common electrode lead is electrically connected with the electrostatic protective layer.

At least one embodiment of the present disclosure further provides an electronic device, and the electronic device comprises any one of the substrates in the above mentioned embodiments.

At least one embodiment of the present disclosure further provides a method of manufacturing a substrate, and the substrate comprises a working region and a non-working region surrounding the working region, and the manufacturing method comprises: providing a base substrate; forming a peripheral circuit and a common electrode lead both in the non-working region and on the base substrate; and the common electrode lead is located on a side of the peripheral circuit close to the working region.

For example, the manufacturing method of the substrate provided by at least one embodiment of the present disclosure further comprises: forming a common electrode, and the common electrode extends from the working region to the non-working region; and the common electrode is in direct contact with at least a portion of the common electrode lead.

For example, the manufacturing method of the substrate provided by at least one embodiment of the present disclosure further comprises: forming a planarization layer, and the planarization layer covers the peripheral circuit and the common electrode lead; the common electrode is located on a side of the planarization layer away from the base substrate; and the forming the planarization layer comprises forming a via hole that exposes the at least a portion of the common electrode lead, and the common electrode is in direct contact with the common electrode lead at the via hole.

For example, the manufacturing method of the substrate provided by at least one embodiment of the present disclosure further comprises: forming a planarization layer, and the common electrode and the common electrode lead are formed on a side of the planarization layer away from the base substrate, and the common electrode is in direct contact with the at least a portion of the common electrode lead.

For example, the manufacturing method of the substrate provided by at least one embodiment of the present disclosure further comprises: forming an electrostatic protective layer, and the electrostatic protective layer is formed on a side of the planarization layer away from the base substrate and covers at least a portion of the peripheral circuit and is electrically connected with the common electrode lead.

BRIEF DESCRIPTION OF THE DRAWINGS

In order to clearly illustrate the technical solution of the embodiments of the present disclosure, the drawings of the embodiments will be briefly described in the following, it is obvious that the described drawings are only related to some embodiments of the present disclosure and thus are not limitative of the present disclosure.

FIG. 3B' is still another schematic diagram of a sectional structure of the substrate along G-G' line in FIG. 2A or I-I' line in FIG. 2B;

FIG. 3B" is still another schematic diagram of a sectional structure of the substrate along G-G' line in FIG. 2A or I-I' line in FIG. 2B;

DETAILED DESCRIPTION

Figure 1:
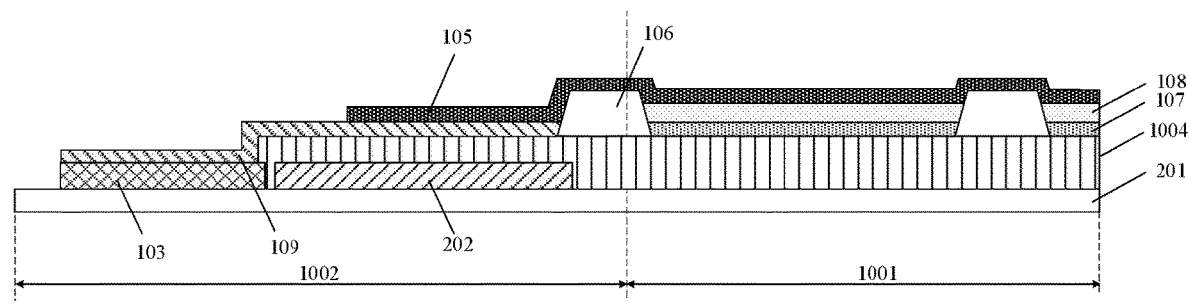
FIG. 1 is a schematic diagram of a sectional structure of a substrate.

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The terms "on," "under," "right," "left" and the like are only used to indicate relative position relationship, and when the position of an object is described as being changed, the relative position relationship may be changed accordingly.

The dimensions of the drawings of the present disclosure are not strictly drawn in actual proportions and the number of array units in a substrate is not limited to the number shown in the drawings. The specific sizes and quantities of each of the structures in the appended drawings of the present disclosure are determined according to actual requirements. The drawings described in the present disclosure are only schematic diagrams of the structure.

FIG. 1 is a schematic diagram of a sectional structure of a substrate, for example, the substrate is a display substrate, and the display substrate is used for forming an organic display device. As illustrated in FIG. 1, the display substrate comprises a base substrate 201, a driving circuit 202 and a common electrode lead 103. The display substrate comprises a display region 1001 and a non-working region 1002 surrounding the display region 1001. The driving circuit 202 is disposed in the non-working region 1002 of the display substrate, for example the driving circuit 202 is a gate driving circuit, such as the gate driving circuit integrated on an array substrate (GOA). A common electrode lead 103 is arranged in the non-working region 1002 of the base substrate 201 and is located on a side of the driving circuit 202 away from the display region 1001 and extends along an outer contour edge of the base substrate 201.

The display substrate further comprises a planarization layer 1004 covering the driving circuit 202 and a portion of the common electrode lead 103, and a portion of the planarization layer 1004 is disposed between the driving circuit 202 and the common electrode lead 103 to insulate the driving circuit 202 from the common electrode lead 103. The display substrate further comprises a bridging electrode 109 and a common electrode 105. The common electrode 105 is electrically connected with the common electrode lead 103 by the bridging electrode 109, that is, the bridging electrode 109 serves as a bridge for electrically connecting the common electrode 105 with the common electrode lead 103. The common electrode 105 extends from the display region 1001 to the non-working region 1002, and the common electrode 105 is in contact with an end of the bridging electrode 109 close to the display region 1001 to realize that the common electrode 105 is electrically connected with the bridging electrode 109. An end of the bridging electrode 109 away from the display region 1001 is in contact with the common electrode lead 103 to realize that the bridging electrode 109 is electrically connected with the common electrode lead 103, and to realize that the common electrode 105 is electrically connected with the common electrode lead 103.

In the display substrate illustrated in FIG. 1, the common electrode is electrically connected with the common electrode lead by the bridging electrode. A distance between the common electrode lead and the common electrode is large, and a length of the bridging electrode is large, and a resistance between the common electrode lead and the common electrode is large. On the one hand, the situation is not conducive to the reduction of voltage drop of a local circuit and an overall circuit, and thus affects the transmission speed of signals, which results in uneven brightness of a display screen; on the other hand, the larger resistance causes an increase in Joule heat, which shortens the life of a display device including the display substrate. In addition, in a case that the common electrode and the bridging electrode are formed by an evaporation method, an error of mask position in the evaporation process causes a contacting area between the common electrode and the bridging electrode and a contacting area between the bridging electrode and the common electrode lead are unfixed. Therefore, the contacting area between the common electrode and the bridging electrode and the contacting area between the bridging electrode and the common electrode lead are directly influenced by the position of the evaporation mask. The unfixed contacting area between the common electrode and the bridging electrode and the unfixed contacting area between the bridging electrode and the common electrode lead eventually cause the problem that a size error of the substrate is excessively large.

In addition, the error of the mask position in the process of evaporating also causes the distance between the common electrode lead and the outer contour edge of the substrate to be unfixed. It is generally required to arrange a dam on a side of the common electrode lead 103 close to the outer contour edge of the substrate, for example, the dam is used for cooperating with an encapsulation layer or an encapsulating substrate to achieve encapsulation. The dam usually needs to reserve a certain distance for the common electrode lead. The distance is also affected by the position error of the evaporation mask. If the evaporation mask is too close to the dam, it is necessary to have a larger distance between the dam and the evaporation mask, which is not conducive to forming a display device with a narrow frame.

At least one embodiment of the present disclosure provides a substrate, and the substrate comprises: a working region and a non-working region surrounding the working region; a base substrate; a peripheral circuit and a common electrode lead; and the peripheral circuit and the common electrode lead are disposed on the base substrate and in the non-working region; and the common electrode lead is located on a side of the peripheral circuit close to the working region.

Figure 2A:
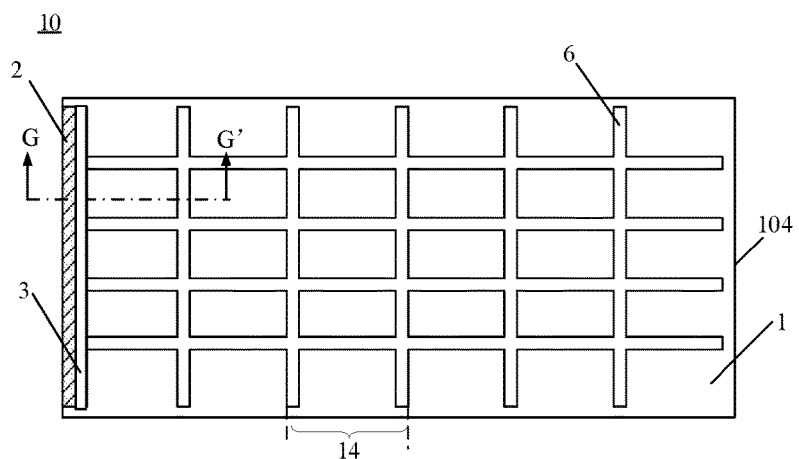
FIG. 2A is a schematic diagram of a planar structure of a substrate provided by an embodiment of the present disclosure.
Figure 2B:
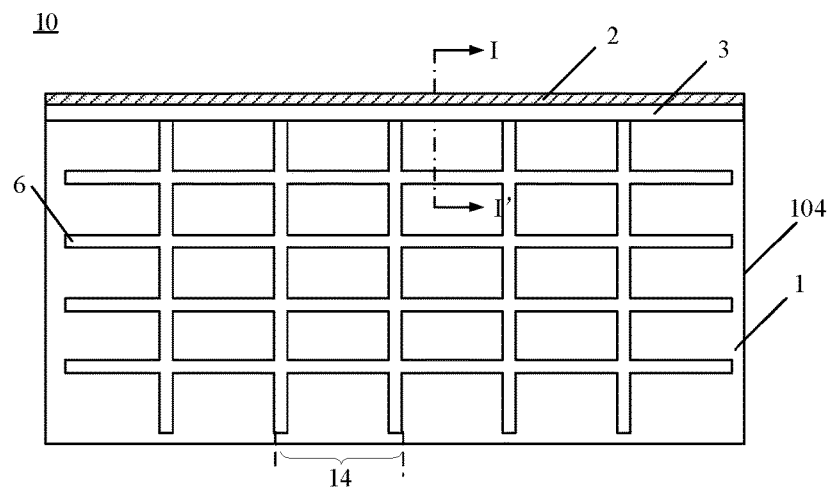
FIG. 2B is a schematic diagram of a planar structure of a substrate provided by another embodiment of the present disclosure.
Figure 2C:
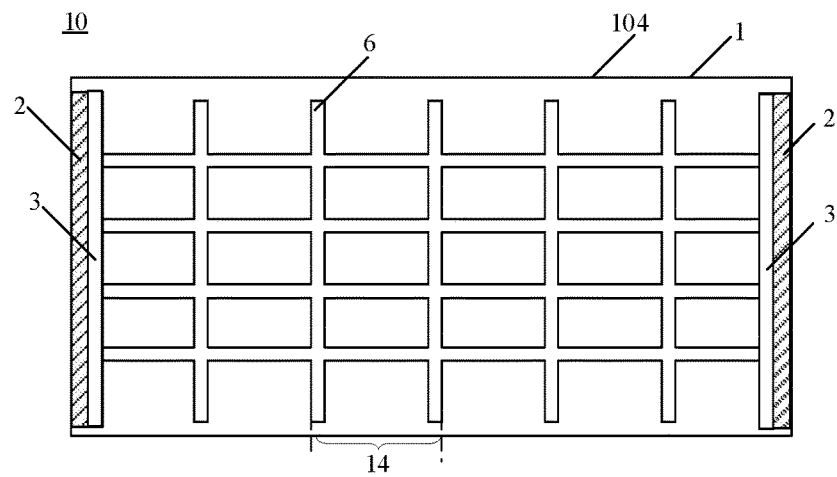
FIG. 2C is a schematic diagram of a planar structure of a substrate provided by still another embodiment of the present disclosure.
Figure 3A:
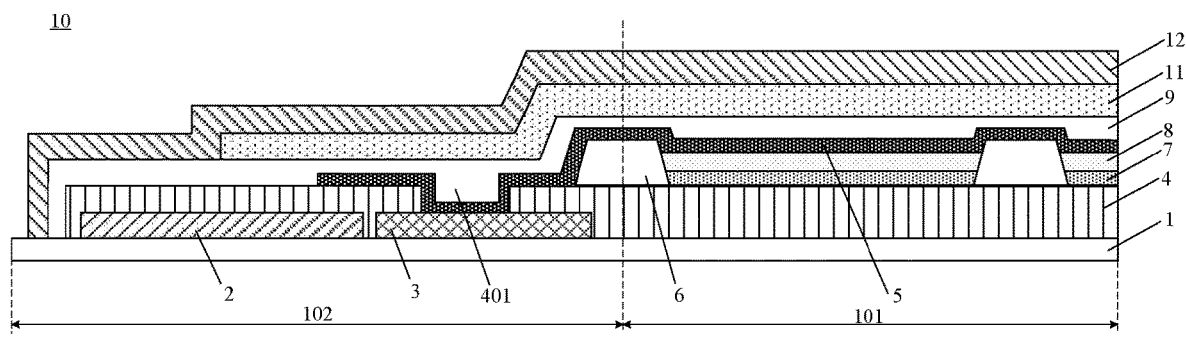
FIG. 3A is a schematic diagram of a sectional structure of the substrate along 'G-G' line in FIG. 2A or along I-I' line in FIG. 2B.

Exemplarily, FIG. 2A is a schematic diagram of a planar structure of a substrate provided by an embodiment of the present disclosure, FIG. 2B is a schematic diagram of a planar structure of another substrate provided by an embodiment of the present disclosure, and FIG. 2C is a schematic diagram of a planar structure of a substrate provided by still another embodiment of the present disclosure, and FIG. 3A is a schematic diagram of a sectional structure of the substrate along G-G' line in FIG. 2A or along I-I' line in FIG. 2B.

As illustrated in FIG. 2A and FIG. 3A, the substrate 10 comprises a working region 101, a non-working region 102 surrounding the working region 101, a base substrate 1, a peripheral circuit 2, a common electrode lead 3 and a common electrode 5. The peripheral circuit 2 and the common electrode lead 3 are in the non-working region 102 and arranged on the base substrate 1. The common electrode 5 extends from the working region 101 to the non-working region 102. The common electrode lead 3 is located on a side of the peripheral circuit 2 close to the working region 101. The common electrode 5 is in direct contact with at least a portion of the common electrode lead 3.

For example, the base substrate 1 comprises an outer contour edge 104. For example, for a display device or an illumination device, the working region 101 is a display region or a luminous region and so on, correspondingly, the non-working region 102 is a non-display region or a non-luminous region, etc. For example, although the non-working region 102 is not used for displaying or emitting light, etc., it can be provided with circuits, pads, interconnection structures, etc., for supporting and implementing functions of displaying or emitting light. The peripheral circuit 2 (the peripheral circuit structure is not specifically illustrated in the FIG. 2A and FIG. 3A) is in the non-working region 102 and on the base substrate 1. The peripheral circuit 2 may be used for controlling a working state of the working unit 14 in the working region 101. For example, in a case that the working unit 14 is a light-emitting unit, the peripheral circuit 2 is used for controlling the light-emitting unit to emit light or not, or for controlling the intensity of the emitted light. The peripheral circuit is a driving circuit, for example, a gate driving circuit or a data driving circuit. For example, the embodiment of the present disclosure does not limit the type and specific structure of the peripheral circuit 2. For example, the gate driving circuit is a gate driving circuit integrated on the array substrate (GOA).

The common electrode lead 3 is located on the base substrate 1 and is arranged along a portion of the outer contour edge of the base substrate 1, that is, the common electrode lead 3 extends along a portion of the outer contour edge of the base substrate 1. The common electrode lead 3 is located on a side of the peripheral circuit 2 close to the working region 101, which makes the common electrode lead 3 close to the common electrode formed in subsequent, so that the common electrode lead 3 is in direct contact with the common electrode formed in subsequent to realize that the common electrode lead 3 is electrically connected with the common electrode, which reduces the resistance of the signal transmitted from the common electrode lead 3 to the common electrode. For example, the common electrode lead 3 is a cathode lead.

For example, the common electrode 5 extends from the working region 101 to the non-working region 102. The common electrode 5 is in direct contact with a portion of the common electrode lead 3 to realize that the common electrode 5 is electrically connected with the common electrode lead 3. For example, the common electrode 5 is a cathode. Compared with the case that the common electrode lead 3 is electrically connected with the common electrode 5 by the bridging electrode, on the one hand, the common electrode lead 3 is in direct contact with the common electrode to realize that the common electrode lead 3 is electrically connected with the common electrode, which reduces the resistance of the circuit that transmits the signal from the common electrode lead to the common electrode, and is conducive to improving the transmission speed of the signal between the common electrode lead and the common electrode. For example, in the case that the substrate is a display substrate, the brightness uniformity of a display screen becomes better, and thus the display effect becomes better. Moreover, the reduction in the resistance of the circuit that transmits the signal from the common electrode lead to the common electrode is conducive to reducing the power consumption and Joule heat in the working process, a temperature rise caused by the Joule heat is reduced, and thus the life of the device such as the display device including the substrate is prolonged.

On the other hand, for the substrate 10 provided by the embodiment of the present disclosure, in the process of forming the common electrode 5 and the common electrode lead 3 by the evaporation method, even if there is a position error of the evaporation mask, a certain size of the contacting area between the common electrode 5 and the common electrode lead is able to be ensured. Therefore, there is no need to reserve an excessive distance between the common electrode lead 3 and the dam 104 close to the outer contour edge of the base substrate 1, which is conducive to realizing the narrow frame. It is also possible to avoid the problem such as inconsistent dimensional error of the substrate or inconsistent uniformity of display brightness caused by the position errors of the evaporation mask in many production processes.

It should be noted that, in the embodiment of the present disclosure, the common electrode lead being in direct contact with the common electrode means that at least a portion of the common electrode lead is in contact with at least a portion of the common electrode lead, and there is no other component (for example, a bridging electrode, a wire, etc.) for connecting the common electrode lead with the common electrode at the contact position.

In the substrate as illustrated in FIG. 1, the resistance involved in the electrical signal that transmitted from the common electrode lead to the common electrode is: a sum of a resistance of the common electrode lead, a contacting resistance of the common electrode lead and the bridging electrode, a resistance of the bridging electrode, a contacting resistance of the bridging electrode and the common electrode, and a resistance of the common electrode. In the substrate provided by the embodiment of the present disclosure, the resistance involved in the electrical signal that transmitted from the common electrode lead to the common electrode is: the sum of the resistance of the common electrode lead, the contacting resistance between the common electrode lead and the common electrode, and the resistance of the common electrode. Therefore, compared with the case that the common electrode lead is electrically connected with the common electrode by the bridging electrode, in the substrate provided by the embodiment of the present disclosure, the resistance of the circuit that transmits the signal from the common electrode lead to the common electrode is decreased.

For example, as illustrated in FIG. 3A, the substrate 10 further comprises a planarization layer 4 covering the peripheral circuit 2 and the common electrode lead 3. At the same time, for example, a portion of the planarization layer 4 is located between the peripheral circuit 2 and the common electrode lead 3 to insulate the peripheral circuit 2 from the common electrode lead 3. The common electrode 5 is located on a side of the planarization layer 4 away from the base substrate 1. The planarization layer 4 comprises a via hole 401 that exposes a portion of the common electrode lead 3. The common electrode 5 is in direct contact with the common electrode lead 3 at the via hole 401 to realize that the common electrode 5 is electrically connected with the common electrode lead 3. For example, in a plane parallel to a surface of the base substrate 1, the planar shape of the via hole 401 is in a shape of a point, such as a circle, an ellipse, a polygon (such as a triangle, a rectangle, etc.).

Of course, in other examples, the planarization layer 4 further comprises the via hole that exposes a portion of the common electrode lead 3, and in the plane parallel to the surface of the base substrate 1, the planar shape of the via hole is in a shape of strip, such as a rectangle, a wave line, etc. The common electrode 5 is electrically connected with the common electrode lead 3 by the via hole. The shape of the via hole is not limited in the embodiment of the present disclosure. Of course, in other embodiments of the present disclosure, the via hole mentioned above exposes the whole common electrode lead, which is not limited by the embodiments of the present disclosure.

The common electrode lead 3 and the peripheral circuit 2 are used for controlling the working state of the working region 101. For example, as illustrated in FIG. 2A, the common electrode lead 3 and the peripheral circuit 2 are located on a left side of the substrate 10 close to the outer contour edge, and a control signal is input from the left side of the substrate 10 to the working region 101. For example, as illustrated in FIG. 2B, the common electrode lead 3 and the peripheral circuit 2 are disposed on an upper side of the substrate 10 close to the outer contour edge, and the control signal is input from the upper side of the substrate 10 to the working region 101. For another example, as illustrated in FIG. 2C, the common electrode lead 3 and the peripheral circuit 2 are disposed on two opposite sides of the substrate 10, such as the left side and the right side of the substrate 10 close to the outer contour edge. In this way, the control signal is input to the working region 101 from both the left side and the right side of the substrate 10 at the same time, and the technical effect of reducing the signal delay is achieved, so that the substrate 10 has a better working effect. For the case that the planar area of the substrate 10 is large, the technical effect is more prominent. It should be noted that "left", "right", "upper" in the embodiments of the present disclosure refer to the relative positions shown in the corresponding drawings.

For example, the material of both the common electrode lead 3 and the common electrode 5 is a transparent conductive material or an opaque conductive material. For example, the transparent conductive material is indium tin oxide (ITO) or indium zinc oxide (IZO). The opaque conductive material is a metal material, for example the metal material having high electrical conductivity, such as copper, aluminium, a copper alloy, an aluminium alloy, etc. In a case that the common electrode lead 3 and the common electrode 5 are made of the above materials or other materials having a high conductivity, it is conducive to increasing the speed of transmitting the common signal. For example, in the case that the working region 101 is the luminous region and light needs to be emitted from a side of the common electrode 5 in FIG. 3A, the common electrode 5 is made of the transparent conductive material.

The materials mentioned above are only exemplary examples. The material of the common electrode lead and the material of the common electrode are not limited in the embodiments of the present disclosure, those skilled in the art can select according to specific requirements.

For example, the working region 101 comprises a plurality of working units 14 arranged in an array. Each of the working units comprises an array element, for example, the array element comprises a first electrode 7, a functional layer 8 and a second electrode 5. The first electrode 7 is disposed on the base substrate 1, for example, the first electrode 7 is disposed on a side of the planarization layer 4 away from the base substrate 1. The functional layer 8 is disposed on a side of the first electrode 7 away from the base substrate 1. In the embodiment of the present disclosure, the second electrode is a common electrode, and the second electrode is disposed on a side of the functional layer 8 away from the base substrate 1. For example, the functional layer 8 is an electroluminescent layer, such as an organic light-emitting layer. For example, the array element is an organic light-emitting diode component. The organic light-emitting diode component is a top-emitting structure, a bottom-emitting structure or other structure. Exemplarily, the organic light-emitting diode component comprises an anode and a cathode which are disposed opposite to each other, and an organic light-emitting layer disposed between the anode and the cathode.

For example, in the example illustrated in FIG. 3A, the first electrode 7 is the anode. In this situation, the common electrode lead 3 is a common cathode lead, and the common cathode lead inputs a low level signal to the common electrode 5 in the process of working. For example, the anode is a reflective electrode or the anode comprises a reflective layer (not shown in FIG. 3A), and in the process of working, light is emitted from the cathode; alternatively, the cathode is a reflective electrode or the cathode comprises a reflective layer, and in the process of working, light is emitted from the anode. In other examples of embodiments of the present disclosure, the position of the anode and the position of the cathode are interchangeable. For example, the anode is the common electrode 5, and the first electrode 7 is the cathode. In this situation, the common electrode lead 3 is a common anode lead, and the common anode lead inputs a high level signal to the common electrode 5 in the process of working.

For example, the substrate 10 further comprises a pixel definition layer 6 to define a plurality of light-emitting units or a plurality of pixel units to prevent light crosstalk between adjacent light-emitting units or adjacent pixel units. The pixel definition layer 6 comprises openings corresponding to the working units 14, and the functional layer 8 is at least disposed in the openings, for example, the common electrode 5 covers the pixel definition layer 6.

For example, the peripheral circuit 2 is the gate driving circuit or the data driving circuit, etc. For example, the gate driving circuit or the data driving circuit comprises a thin film transistor, a capacitor, a gate lead or a data lead and so on according to different examples.

For example, the substrate 10 is a flexible substrate. In this situation, the substrate 10 further comprises a flexible encapsulation layer, and the flexible encapsulation layer comprises a first organic encapsulation layer 9, an inorganic encapsulation layer 11 and a second organic encapsulation layer 12. The first organic encapsulation layer 9 covers the working region 101 and a portion of the non-working region 102. The inorganic encapsulation layer 11 is arranged on the first organic encapsulation layer 9 and covers the working region 101 and a portion of the non-working region 102. The second organic encapsulation layer 12 is arranged on the inorganic encapsulation layer 11 and covers the working region 101 and the portion of the non-working region 102, and further covers a portion of the base substrate 1. The first organic encapsulation layer 9 has a weak ability to isolate water and oxygen, and the inorganic encapsulation layer 11 has a good ability to isolate water and oxygen. Therefore, the inorganic encapsulation layer 11 makes the flexible substrate have a better ability to isolate water and oxygen to protect the functional layer 8 on the flexible substrate.

For example, the material of both the first organic encapsulation layer 9 and the second organic encapsulation layer 12 is selected from the group consisting of polyimide, polyester, polyfluoride and combination thereof. The polyimide has advantages of excellent light transmission, high temperature resistance and bending resistance. Of course, the material of the first organic encapsulation layer 9 and the material of the second organic encapsulation layer 12 are not limited to the types mentioned above.

For example, the material of the inorganic encapsulation layer 11 comprises silicon oxide or silicon nitride. Of course, the material of the inorganic encapsulation layer 11 is not limited to the types mentioned above, as long as the inorganic encapsulation layer 11 is an inorganic layer with a good ability to isolate water and oxygen.

For example, in the case that the substrate 10 is a flexible substrate, the material of the base substrate 1 is selected from the group consisting of polyimide, polyester, polyfluoride and combination thereof. Of course, the material of the base substrate is not limited in the embodiment of present disclosure.

Figure 3B:
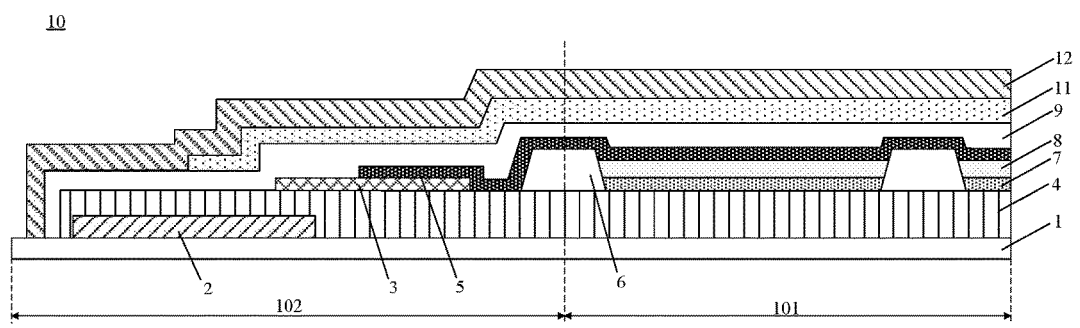
FIG. 3B is another schematic diagram of a sectional structure of the substrate along G-G' line in FIG. 2A or I-I' line in FIG. 2B.
Figure 3B:
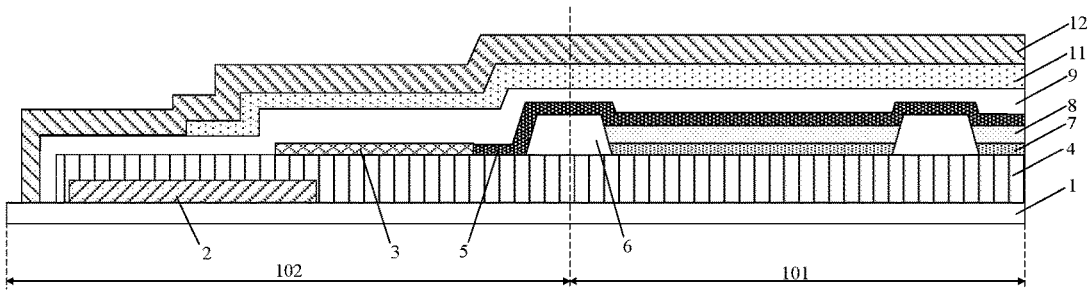

FIG. 3B is another schematic diagram of a sectional structure of the substrate along G-G' line in FIG. 2A or I-I' line in FIG. 2B. FIG. 3B shows another substrate provided by the embodiment of the present disclosure. As illustrated in FIG. 3B, the common electrode 5 and the common electrode lead 3 are disposed on the planarization layer 4, and the common electrode 5 directly lies on a portion of the common electrode lead 3 to be in direct contact with the common electrode lead 3. Of course, in other embodiments of the present disclosure, the common electrode 5 directly lies on the whole common electrode lead 3 to be in direct contact with the common electrode lead 3. In this way, the technical effects similar to those of the substrate shown in FIG. 3A are achieved, which may refer to the above descriptions, and details are not described herein again.

It should be noted that, in the embodiments of the present disclosure, the common electrode directly lying on the common electrode lead means: a portion of the common electrode overlaps with at least a portion of the common electrode lead in a direction perpendicular to the substrate, and the portion of the common electrode is in contact with the at least a portion of the common electrode lead to achieve that the common electrode is electrically connected with the common electrode lead. There is no other layers between the common electrode and the common electrode lead, and the common electrode does not necessarily to be connected with the common electrode lead by the via hole.

In FIG. 3B, the planarization layer 4 of the substrate 10 covers the peripheral circuit 2 and a portion of the base substrate 1. A portion of the planarization layer 4 is located between the common electrode lead 3 and the peripheral circuit 2 to insulate the common electrode lead 3 from the peripheral circuit 2.

For example, as illustrated in FIG. 3B, the common electrode lead 3 is disposed on a same layer as the first electrode 7. In this way, the common electrode lead 3 and the first electrode 7 are formed simultaneously by a same material and by a same process, which is conducive to simplifying the manufacturing process of the substrate 10 and improving the production efficiency.

For example, as illustrated in FIG. 3B, a portion of an orthographic projection of the common electrode lead 3 on the base substrate 1 overlaps with a portion of an orthographic projection of the peripheral circuit 2 on the base substrate 1, which is conducive to further reducing the size of the frame of the substrate, and thereby reducing the size of the frame of the device including the substrate, such as a display device.

The other characteristics and effects of the substrate shown in FIG. 3B are the same as those of the substrate illustrated in FIG. 3A, which may refer to the above descriptions.

For example, FIG. 3B' is still another schematic diagram of a sectional structure of the substrate along G-G' line in FIG. 2A or I-I' line in FIG. 2B. FIG. 3B' shows another substrate provided by the embodiment of the present disclosure. As illustrated in FIG. 3B', the common electrode 5 and the common electrode lead 3 are disposed on the planarization layer 4, and an end of the common electrode 5 is abutted with an end of the portion of the common electrode lead 3 to make the common electrode be in direct contact with the common electrode lead. The substrate shown in FIG. 3B' can also achieve the same technical effect as the substrate shown in FIG. 3A, which may refer to the above descriptions and omitted herein.

It should be noted that, in the embodiment of the present disclosure, an end of the common electrode 5 being abutted with an end of the portion of the common electrode lead 3 means that the common electrode and the portion of the common electrode lead are in direct contact only at their ends, and the orthographic projection of the common electrode on the base substrate does not overlap with the orthographic projection of the common electrode lead on the base substrate.

For example, FIG. 3B" is still another schematic diagram of a sectional structure of the substrate along G-G' line in FIG. 2A or I-I' line in FIG. 2B. FIG. 3B" shows another substrate provided by the embodiment of the present disclosure. As illustrated in FIG. 3B", the common electrode 5 and the common electrode lead 3 are disposed on the planarization layer 4, and the common electrode lead 3 directly lies on at least a portion of the common electrode 5 to be in direct contact with the common electrode 5. Of course, in other embodiments of the disclosure, the common electrode lead 3 may also be directly lies on the whole common electrode 5 to be in direct contact with the common electrode 5. The substrate shown in FIG. 3B" can also achieve the same technical effect as the substrate shown in FIG. 3A, which may refer to the above descriptions and omitted herein.

Figure 3C:
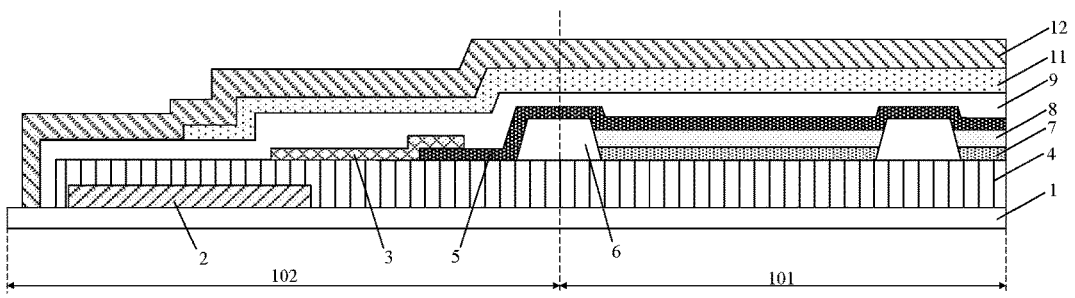
FIG. 3C is still another schematic diagram of a sectional structure of the substrate along G-G' line in FIG. 2A or I-I' line in FIG. 2B.
Figure 3C:
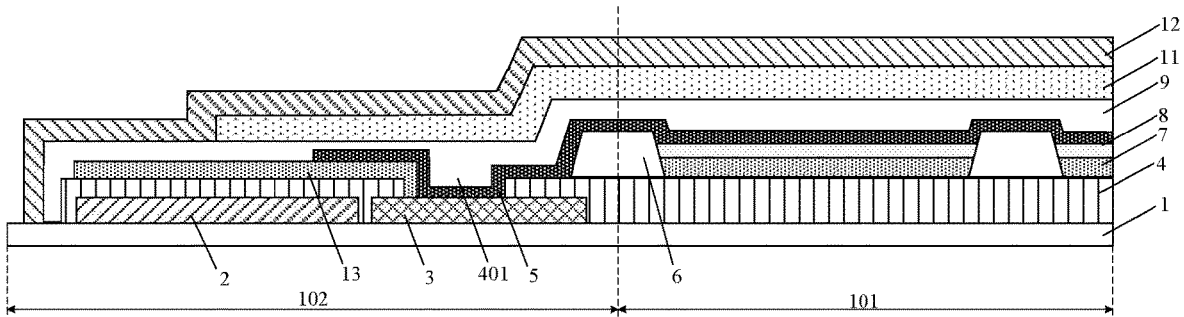
Figure 3C:
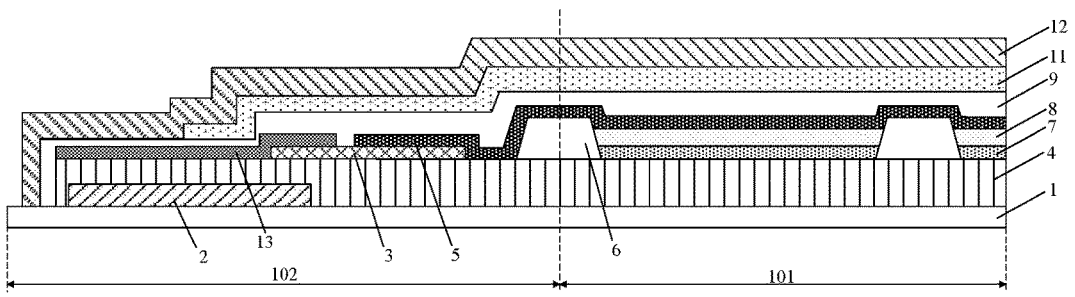
Figure 3C:
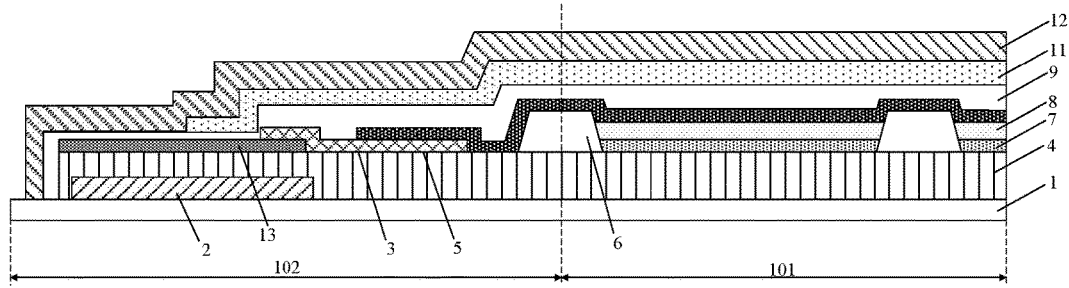

FIG. 3C is still another schematic diagram of a sectional structure of the substrate along G-G' line in FIG. 2A or I-I' line in FIG. 2B, and FIG. 3C shows still another substrate provided in the embodiment of the present disclosure. The difference between the substrate shown in FIG. 3C and the substrate shown in FIG. 3A is that the substrate 10 in FIG. 3C further comprises an electrostatic protective layer 13, and the electrostatic protective layer 13 is located on a side of the planarization layer 4 away from the base substrate 1, and the electrostatic protective layer 13 covers the peripheral circuit 2 and is electrically connected with the common electrode lead 3. For example, the common electrode 5 is disposed on the electrostatic protective layer 13, and the common electrode 5 directly lies on the electrostatic protective layer 13. One end of the electrostatic protective layer 13 close to the common electrode lead 3 is in direct contact with the common electrode lead 3 by the via hole 401 to realize that the electrostatic protective layer 13 is electrically connected with the common electrode lead 3. For example, other via holes are formed in the planarization layer so that the end of the electrostatic protective layer 13 close to the common electrode lead 3 is in direct contact with the common electrode lead 3 by the other via holes, instead of using a same via hole with the common electrode. The electrostatic protective layer 13 conducts the static electricity outside the peripheral circuit 2 by the common electrode lead to prevent the electrostatic from entering the peripheral circuit 2 and interfering the working state of the peripheral circuit 2. Thus, the electrostatic protective layer 13 and the common electrode lead 3 can be used as a portion of an electrostatic prevention circuit. In the case that the electrostatic prevention circuit needs to be arranged on the substrate 10, the components of the substrate 10 may be simplified.

FIG. 3C' is still another schematic diagram of a sectional structure of the substrate along G-G' line in FIG. 2A or I-I' line in FIG. 2B, and FIG. 3C' shows another substrate provided in the embodiment of the present disclosure. The difference between the substrate shown in FIG. 3C' and the substrate shown in FIG. 3B is that the substrate 10 in FIG. 3C' further comprises an electrostatic protective layer 13, which is located on a side of the planarization layer 4 away from the base substrate 1 and covers the peripheral circuit 2 and is electrically connected with the common electrode lead 3. For example, the electrostatic protective layer 13 directly lies on at least a portion of the common electrode lead 3 to realize that the electrostatic protective layer 13 is electrically connected with the common electrode lead 3. The electrostatic protective layer 13 conducts the static electricity outside the peripheral circuit 2 through the common electrode lead to prevent the static charge from entering the peripheral circuit 2 and interfering with the working state of the peripheral circuit 2. Thus, the electrostatic protective layer 13 and the common electrode lead 3 can be used as a portion of the electrostatic prevention circuit. In the case that the electrostatic prevention circuit needs to be arranged on the substrate 10, the components of the substrate 10 can be simplified.

FIG. 3C" is still another schematic diagram of a sectional structure of the substrate along G-G' line in FIG. 2A or I-I' line in FIG. 2B, and FIG. 3C" shows another substrate provided in the embodiment of the present disclosure. The difference between the substrate shown in FIG. 3C" and the substrate shown in FIG. 3B is that the substrate 10 in FIG. 3C" further comprises an electrostatic protective layer 13, which is located on a side of the planarization layer 4 away from the base substrate 1 and covers the peripheral circuit 2 and is electrically connected with the common electrode lead 3. For example, the common electrode lead 3 directly lies on at least a portion of the electrostatic protective layer 13 to realize that the electrostatic protective layer 13 is electrically connected with the common electrode lead 3. The electrostatic protective layer 13 conducts the static electricity outside the peripheral circuit 2 by the common electrode lead to prevent the static charge from entering the peripheral circuit 2 and interfering with the working state of the peripheral circuit 2. Thus, the electrostatic protective layer 13 and the common electrode lead 3 can be used as a portion of the electrostatic prevention circuit. In the case that the electrostatic prevention circuit needs to be installed on the substrate 10, the components of the substrate 10 may be simplified.

FIG. 3C''' is still another schematic diagram of a sectional structure of the substrate along G-G' line in FIG. 2A or I-I' line in FIG. 2B, and FIG. 3C'' shows another substrate provided in the embodiment of the present disclosure. The difference between the substrate shown in FIG. 3C''' and the substrate shown in FIG. 3B is that the substrate 10 in FIG. 3C''' further comprises an electrostatic protective layer 13, and the electrostatic protective layer 13 is located on a side of the planarization layer 4 away from the base substrate 1 and covers the peripheral circuit 2 and is electrically connected with the common electrode lead 3. For example, another end of the common electrode lead 3 is abutted with one end of the electrostatic protective layer 13 to realize that the electrostatic protective layer 13 is electrically connected with the common electrode lead 3. The electrostatic protective layer 13 conducts the static electricity outside the peripheral circuit 2 by the common electrode lead to prevent the static charge from entering the peripheral circuit 2 and interfering with the working state of the peripheral circuit 2. Thus, the electrostatic protective layer 13 and the common electrode lead 3 can be used as a portion of the electrostatic prevention circuit. In the case that the electrostatic prevention circuit needs to be arranged on the substrate 10, the components of the substrate 10 may be simplified.

It should be noted that, in the embodiment of the present disclosure, the another end of the common electrode lead being abutted with an end of the electrostatic protective layer means that the common electrode lead only contacts the electrostatic protective layer directly at their ends, and the orthographic projection of the common electrode lead on the base substrate does not overlap the orthographic projection of the electrostatic protective layer on the base substrate.

The substrate provided in the embodiment of the present disclosure may be used in an electronic device such as a display device or an illumination device, etc. The substrate provided in the embodiment of the present disclosure can also be a flexible substrate, which can be used in a flexible display panel, a light-emitting panel, etc.

Figure 7:
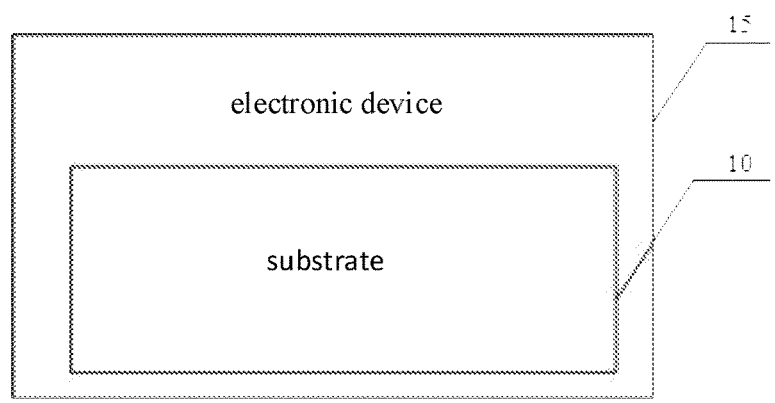
FIG. 7 is a block diagram of an electronic device provided by an embodiment of the present disclosure.

At least one embodiment of the present disclosure further provides an electronic device, and the electronic device comprises any one of the substrates mentioned above. Exemplarily, FIG. 7 is a block diagram of an electronic device provided by an embodiment of the present disclosure. As illustrated in FIG. 7, the electronic device comprises any one of the substrates provided in the embodiments of the present disclosure. For example, the electronic device is a display device. For example, the display device is an organic light-emitting diode display device. For example, the display device is a flexible display device. For example, the display device is a mobile phone, a tablet computer, a television, a display, a notebook computer, a digital photo frame, a navigator, an electronic advertising screen and any other product or component having a display function. For example, the electronic device is an illumination device, for example, the illumination device is a decorative lamp, etc.

FIG. 7 is only a block diagram of a display device comprising any one of the substrates provided in the embodiments of present disclosure, and other structures of the display device is not shown. Those skilled in the art may refer to conventional technology, which is not limited in the embodiments of the present disclosure.

The electronic device provided in the embodiment of the present disclosure reduces the resistance of the electrical connection between the common electrode lead and the common electrode, which is conducive to improving the transmission speed of the signal between the common electrode lead and the common electrode. For example, in a case that the substrate is a light-emitting substrate such as a display substrate, the brightness uniformity of the display screen is improved and the display effect becomes better. Moreover, the reduction of the resistance of the electrical connection between the common electrode lead and the common electrode is conducive to reducing the power consumption and Joule heat in the working process, a temperature rise caused by the Joule heat is reduced, and thus the life of the device such as the display device including the substrate is prolonged. In addition, the electronic device provided in the embodiments of the present disclosure has a narrower frame.

At least one embodiment of the present disclosure further provides a method of manufacturing a substrate, and the substrate comprises a working region and a non-working region surrounding the working region, and the manufacturing method comprises: providing a base substrate; forming a peripheral circuit and a common electrode lead both in the non-working region and on the base substrate, and forming a common electrode in the working region and the non-working region. The common electrode lead is located on a side of the peripheral circuit close to the working region, and the common electrode is in direct contact with at least a portion of the common electrode lead.

Figure 4A:
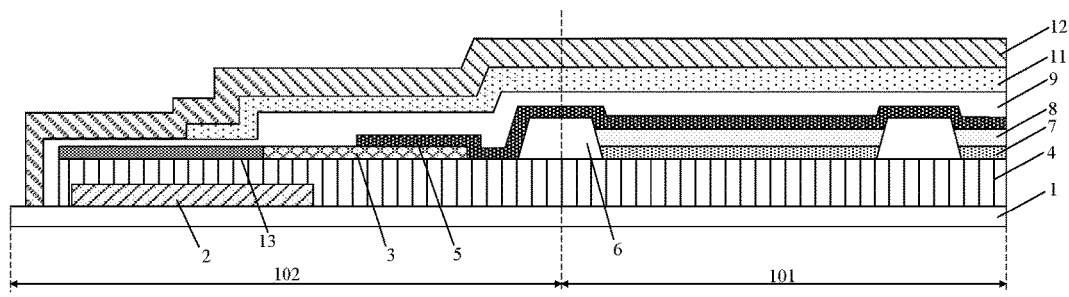
FIG. 4A to FIG. 4O are process schematic diagrams of a manufacturing method of a substrate provided by an embodiment of the present disclosure.
Figure 4A:
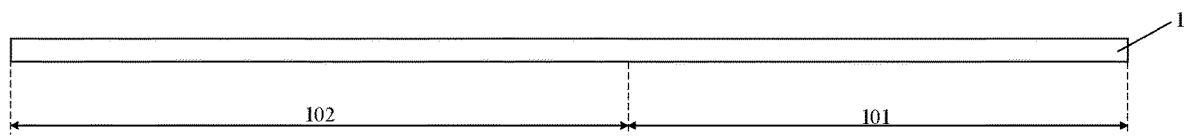
Figure 4B:
Figure 4C:
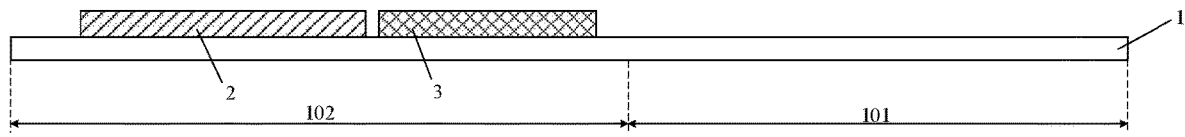
Figure 4D:
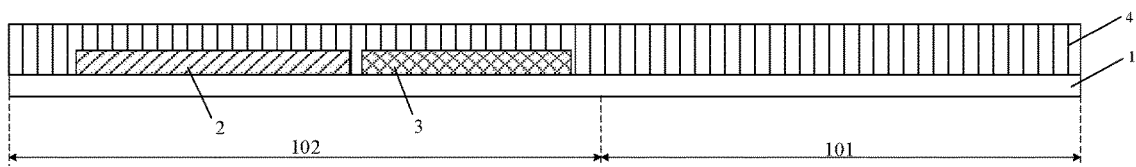
Figure 4E:
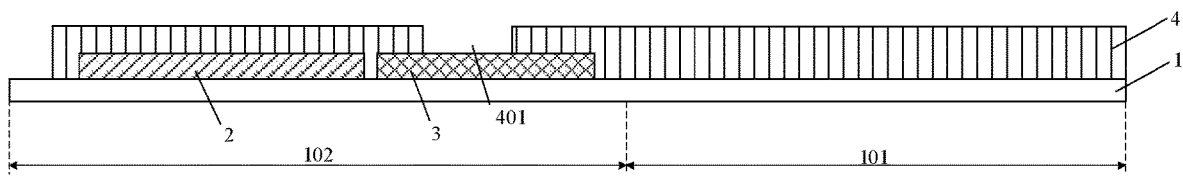
Figure 4F:
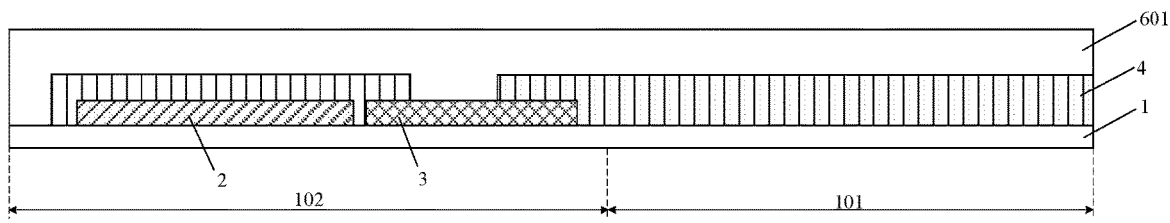
Figure 4G:
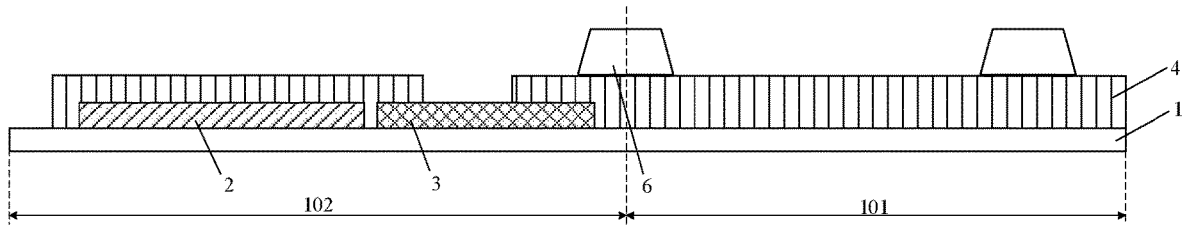
Figure 4H:
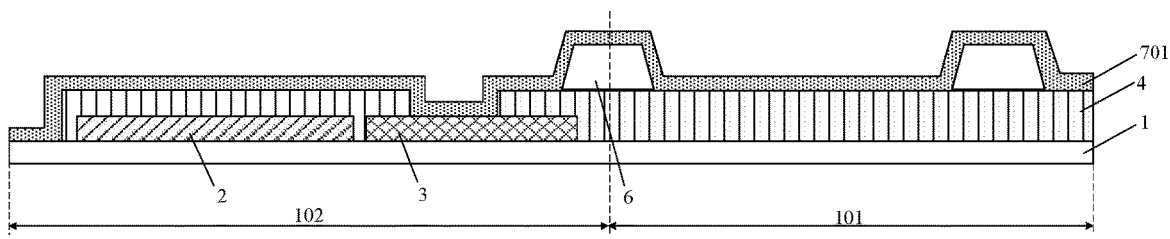
Figure 4I:
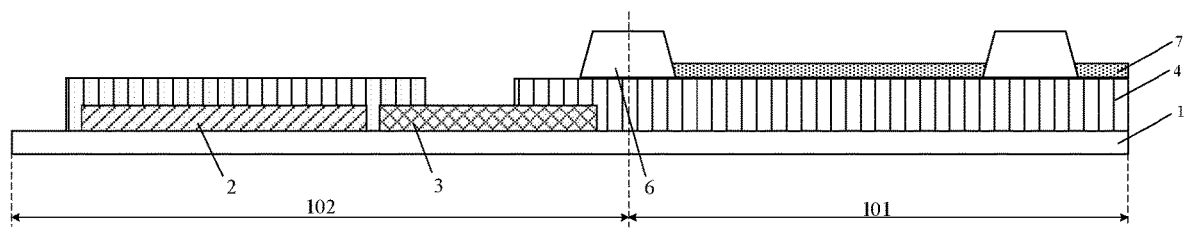
Figure 4J:
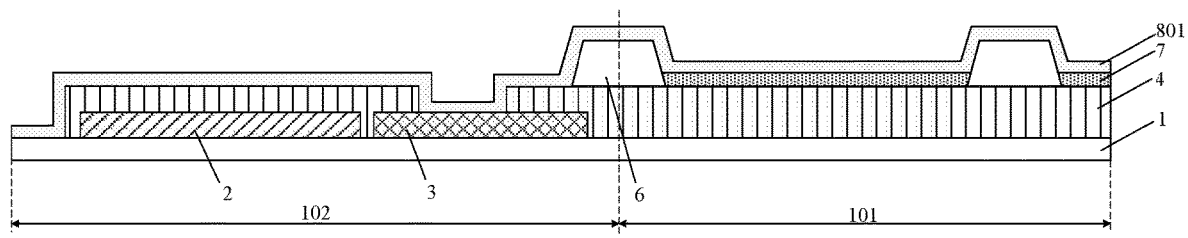
Figure 4K:
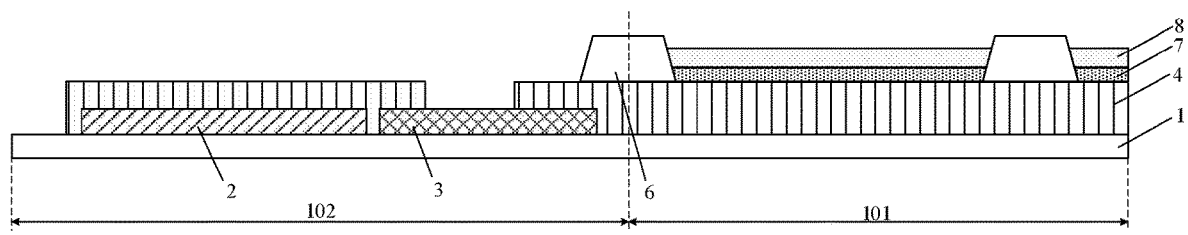
Figure 4L:
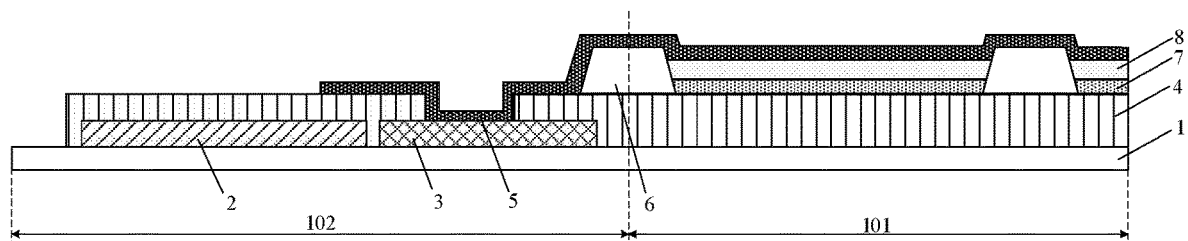
Figure 4M:
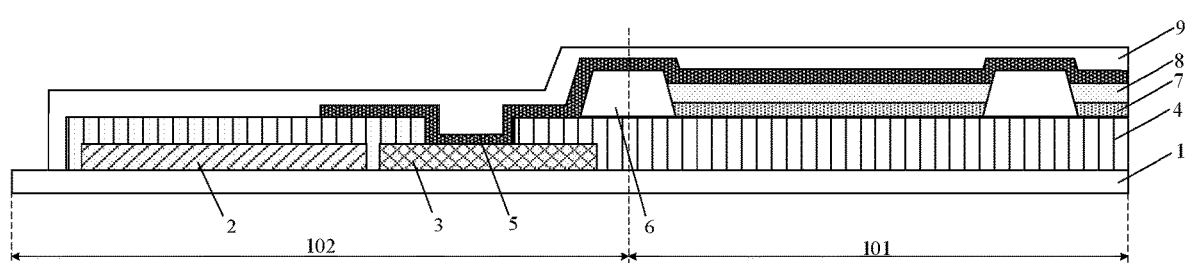
Figure 4N:
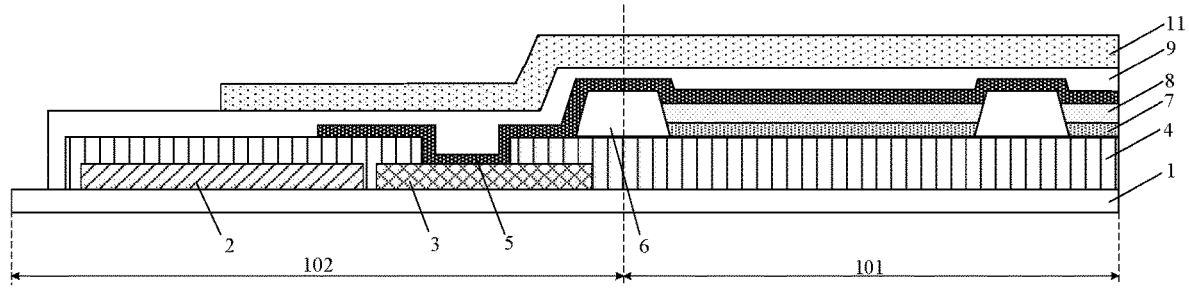
Figure 4O:
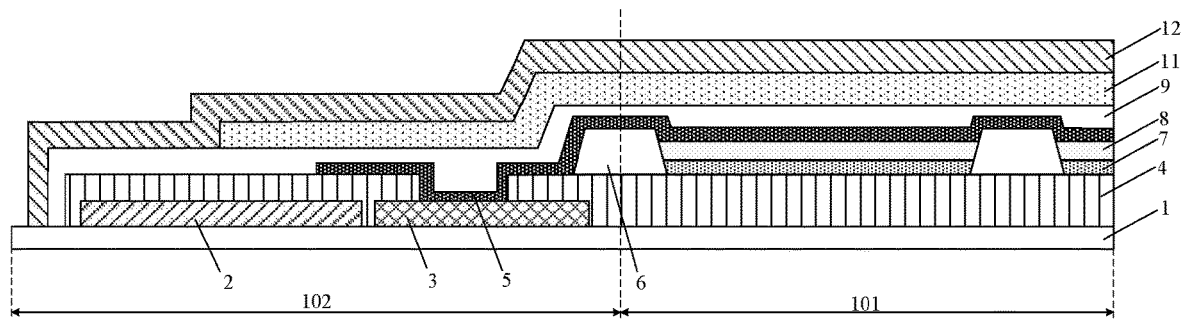

Exemplarily, FIG. 4A to FIG. 4O are process schematic diagrams of a manufacturing method of a substrate provided by an embodiment of the present disclosure. The following is an example of forming the substrate, the substrate including an organic light-emitting diode formed in the working region.

As illustrated in FIG. 4A, the base substrate 1 is provided. For example, the base substrate 1 is a glass substrate, a quartz substrate, a resin (for example, polyethylene) substrate, or a flexible substrate, for example, the base substrate 1 is made of polyimide, etc. The base substrate 1 comprises an outer contour edge, and the working region 101 and the non-working region 102 surrounding the working region 101 are shown in FIG. 4A.

As illustrated in FIG. 4B, the peripheral circuit 2 is formed in the non-working region 102 of the base substrate, and the peripheral circuit 2 is a driving circuit, for example, a gate driving circuit or a data driving circuit. The specific manufacturing method of the peripheral circuit 2 may refer to conventional technology for those skilled in the art.

As illustrated in FIG. 4C, the common electrode lead 3 is located on the side of the peripheral circuit 2 close to the working region 101, so that the common electrode lead 3 is in direct contact with the subsequently formed common electrode which extends from the working region 101 to the non-working region 102. Moreover, there is a certain distance between the common electrode lead 3 and the peripheral circuit 2 to insulate the common electrode lead 3 from the peripheral circuit 2. For example, the material of the common electrode lead 3 is a transparent conductive material or an opaque conductive material. For example, the transparent conductive material is indium tin oxide (ITO) or indium zinc oxide (IZO). The opaque conductive material is a metal material, for example, the metal material having high electrical conductivity, such as copper, aluminium, a copper alloy, an aluminium alloy, etc. The common electrode lead 3 is formed through a chemical vapor deposition method, a magnetron sputtering method or an evaporation method by using a mask.

As illustrated in FIG. 4D, the method further comprises: forming a planarization layer 4. The planarization layer 4 covers the peripheral circuit 2 and the common electrode lead 3. A portion of the planarization layer 4 is located between the common electrode lead 3 and the peripheral circuit 2 to insulate the common electrode lead 3 from the peripheral circuit 2. For example, the material of the planarization layer 4 is an insulating material and acts as an insulating layer at the same time. The insulating material is inorganic material or organic material, for example, the organic material is resin material, such as polyethylene resin, polyacrylic acid resin, polyester resin, polyamide resin, etc. The material of the planarization layer 4 is not limited in the embodiments of the present disclosure.

As illustrated in FIG. 4E, a patterning process is performed on the planarization layer 4, and a via hole 401 exposing a portion of the common electrode lead is formed in the planarization layer 4. For example, the patterning process is a photolithography process. Of course, in another embodiment, a groove exposing a portion of the common electrode lead is formed in the planarization layer 4 by the patterning process, and the groove is a special form of the via hole.

As illustrated in FIG. 4F, a pre-pixel definition layer 601 is formed on the planarization layer 4, for example, the pre-pixel definition layer 601 is formed by a coating method. For example, the material of the pre-pixel definition layer 601 is a photosensitive material which may be used in the subsequent photolithography process. For example, the photosensitive material comprises a photoresist material and a metal halide, such as a silver halide (such as AgCl or AgBr). The material of the pre-pixel definition layer 601 may also be a dark material, such as a black resin, metallic chromium or chromium oxide, etc. The desired patterns are obtained by patterning methods such as a printing method and a photolithography method. Of course, the pre-pixel definition layer 601 may also be made of other materials, and those skilled in the art can select the material of the pre-pixel definition layer 601 according to requirements.

As illustrated in FIG. 4G, the patterning process is performed on the pre-pixel definition layer 601 to form a pixel definition layer 6. The pixel definition layer 6 has openings. The pixel definition layer 6 defines a plurality of working units arranged in an array in the working region 101, that is, a plurality of working units arranged in an array are formed in the working region 101. For example, the patterning process is a photolithography process. For example, the pixel definition layer 6 is formed by an exposure and development process. In the case that the material of the pre-pixel definition layer 601 comprises the photoresist material and the metal halide, and the metal halide is a material with a low optical density in the case that it is not exposed, and the metal halide is decomposed after being exposed to form metal particles. The metal particles are black in color due to their small particles and have high optical density values. For example, the photoresist material is a negative photoresist material, which becomes insoluble in the developer after being exposed and remains, thus the pixel definition layer 6 is formed.

As illustrated in FIG. 4I, for example, first electrodes 7 are formed on the planarization layer 4 through the evaporation method or the deposition method by using a mask, and the first electrodes 7, for example, are anodes. Alternatively, as illustrated in FIG. 4H, a pre-first electrode layer 701 is formed by the evaporation method, the magnetron sputtering method or the chemical vapor deposition method, and then the first electrodes 7 as illustrated in FIG. 4I are formed by the photolithography process. The first electrodes 7 are located in the openings of the pixel definition layer 6 in each of the working units.

As illustrated in FIG. 4K, a functional layer 8 is formed on a side of the first electrodes 7 away from the base substrate 1 through a deposition method by using the mask. For example, the functional layer 8 is an organic light-emitting layer. Alternatively, as illustrated in FIG. 4J, a pre-functional layer 801 is formed by a coating method, and then a functional layer 8 as illustrated in FIG. 4K is formed by the photolithography method. For example, the functional layer 8 is located in the openings of the pixel definition layer 6 in each of the working units.

As illustrated in FIG. 4L, a common electrode 5 is formed. For example, the common electrode 5 is a cathode. Of course, in other embodiments, the common electrode 5 is the anode and the first electrode 7 is the cathode. The common electrode 5 covers the pixel definition layer 6 and extends from the working region 101 to the non-working region 102. In the non-working region 102, the common electrode 5 is in direct contact with the common electrode lead 3 by the via hole 401 to realize that the common electrode 5 is electrically connected with the common electrode lead 3. The technical effects of the common electrode 5 being in direct contact with the common electrode lead 3 may refer to the descriptions in the above mentioned embodiments, which are omitted herein.

For example, in the case that the substrate is the flexible substrate, the manufacturing method of the substrate further comprises: forming a flexible encapsulation layer. Forming the flexible encapsulation layer comprises: forming a first organic encapsulation layer, an inorganic encapsulation layer and a second organic encapsulation layer. As illustrated in FIG. 4M, the first organic encapsulation layer 9 covering the working region 101 and a portion of the non-working region 102 is formed. For example, the material of the first organic encapsulation layer 9 is selected from the group consisting of polyimide, polyester, polyfluoride and combination thereof. The polyimide has advantages of excellent light transmission, high temperature resistance and bending resistance. Of course, the material of the first organic encapsulation layer 9 is not limited to the types mentioned above. For example, the first organic encapsulation layer 9 may be formed by a coating method.

As illustrated in FIG. 4N, the inorganic encapsulation layer 11 is formed on the first organic encapsulation layer 9. For example, the material of the inorganic encapsulation layer 11 comprises silicon oxide or silicon nitride. Of course, the material of the inorganic encapsulation layer 11 is not limited to the types mentioned above, as long as the inorganic encapsulation layer 11 is an inorganic layer with a good ability to isolate water and oxygen. For example, the inorganic encapsulation layer 11 is formed by the evaporation method, the chemical vapor deposition method or the magnetron sputtering deposition method.

As illustrated in FIG. 4O, the second organic encapsulation layer 12 disposed on the inorganic encapsulation layer 11 and covering a portion of the base substrate 1 is formed. The material and the manufacturing method of the second organic encapsulation layer 12 are the same as the material and the manufacturing method of the first organic encapsulation layer 9. By the above methods, a substrate illustrated in FIG. 4O is formed.

It should be noted that, the embodiment of the present disclosure is described by taking a flexible substrate as an example. In some embodiments, the substrates are non-flexible substrates.

Figure 5A:
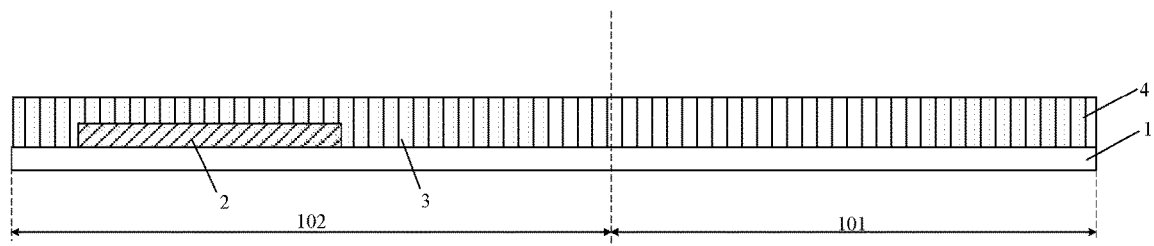
FIG. 5A to FIG. 5F are process schematic diagrams of a manufacturing method of a substrate provided by another embodiment of the present disclosure.

FIG. 5A to FIG. 5F are process schematic diagrams of a manufacturing method of a substrate provided by another embodiment of the present disclosure. After forming the structure shown in FIG. 4B, a planarization layer 4 as illustrated in FIG. 5A is formed, and the planarization layer 4 covers the peripheral circuit 2. The material and the manufacturing method of the planarization layer refer to the descriptions mentioned above.

Figure 5B:
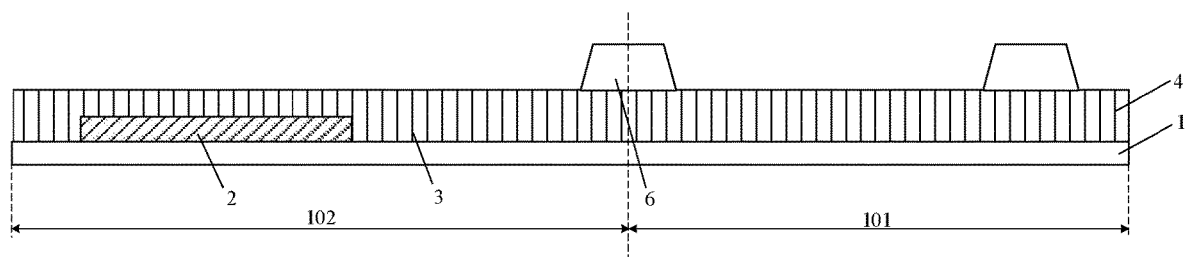
Figure 5C:
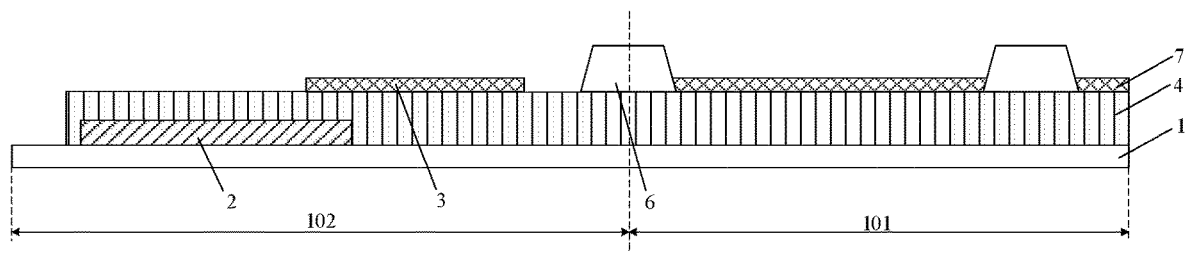

As illustrated in FIG. 5B, the pixel definition layer 6 is formed by the same method as that shown in FIG. 4F to FIG. 4G As illustrated in FIG. 5C, the common electrode lead 3 and the first electrode 7 are formed simultaneously on a side of the planarization layer 4 away from the base substrate 1, that is, the common electrode lead 3 and the first electrode 7 are formed simultaneously by the same process to simplify the manufacturing process of the substrate.

Figure 5D:
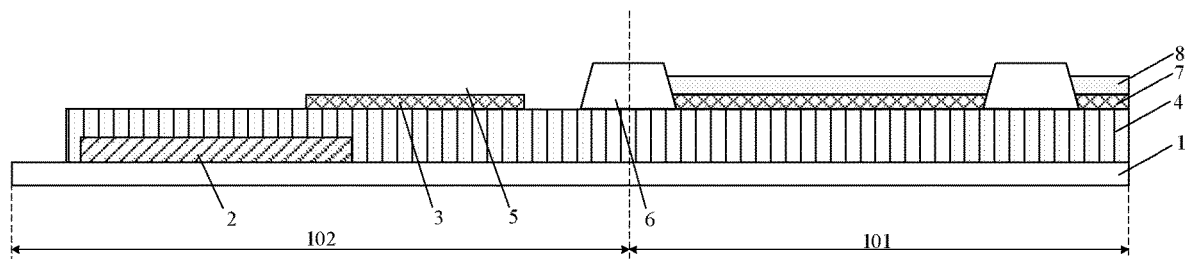

As illustrated in FIG. 5D, the functional layer 8 is formed in the same way as that shown in FIG. 4K.

Figure 5E:
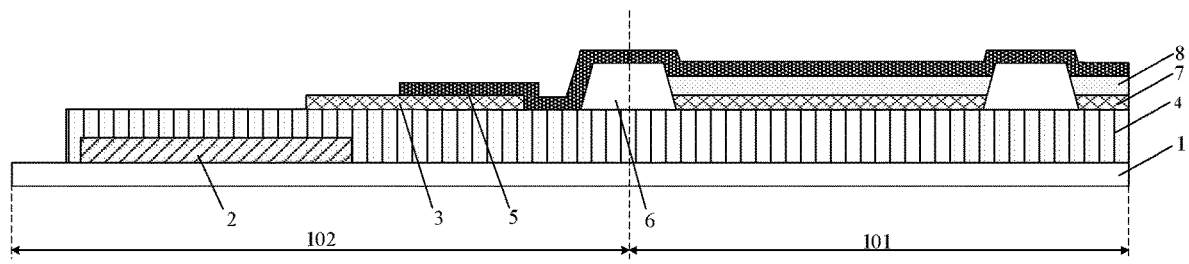
Figure 5E:
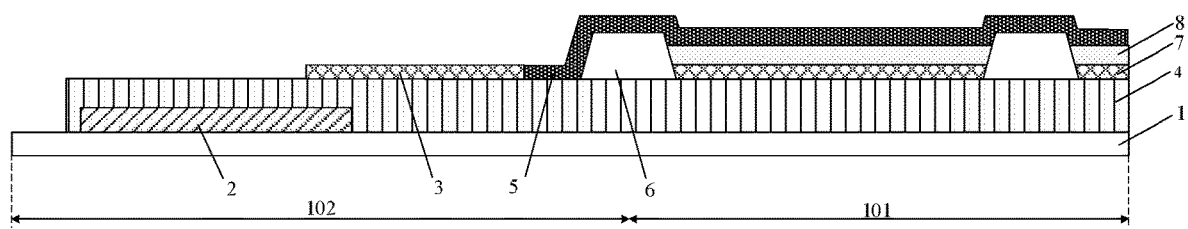

As illustrated in FIG. 5E, the common electrode 5 is formed on the side of the planarization layer 4 away from the base substrate 1. The common electrode 5 covers the pixel definition layer 6 and extends from the working region 101 to the non-working region 102. In the non-working region 102, the common electrode 5 directly lies on a portion of the common electrode lead 3 to be in direct contact with the common electrode lead 3, so as to realize that the common electrode 5 is electrically connected with the common electrode lead 3.

For example, in a variation of FIG. 5E, as illustrated in FIG. 5E', the common electrode 5 is in direct contact with at least a portion of the common electrode lead 3 in a plane parallel to the surface of the base substrate 1 to realize that the common electrode 5 is electrically connected with the common electrode lead 3. That is the situation where the portion of the common electrode 5 overlapped with the common electrode lead 3 is removed. The following up process is based on the structure shown in FIG. 5E.

Figure 5F:
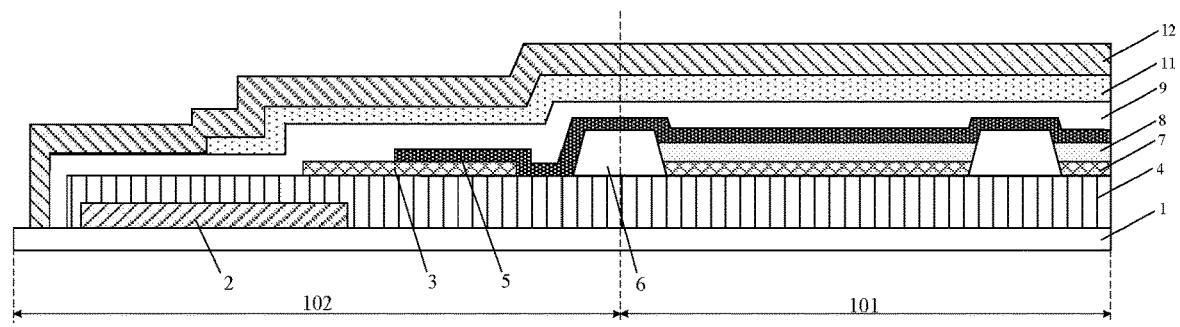

The first organic encapsulation layer 9, the inorganic encapsulation layer 11 and the second organic encapsulation layer 12 are formed through same methods as the methods shown in FIG. 4M to FIG. 4O, and the substrate shown in FIG. 5F is formed.

The method illustrated in FIG. 5A to FIG. 5F has a same or a similar technical effect as the method illustrated in FIG. 4A to FIG. 4O. The other technical characteristics of the method are the same as the method shown in FIG. 4M to FIG. 4O, which refers to the above descriptions.

Figure 6A:
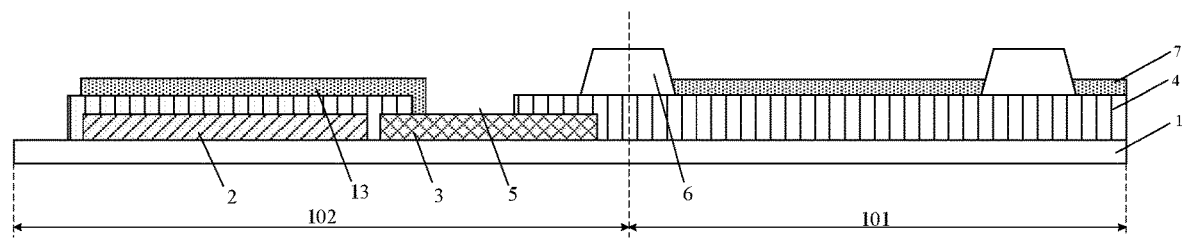
FIG. 6A to FIG. 6B are process schematic diagrams of a manufacturing method of a substrate provided by still another embodiment of the present disclosure.
Figure 6B:
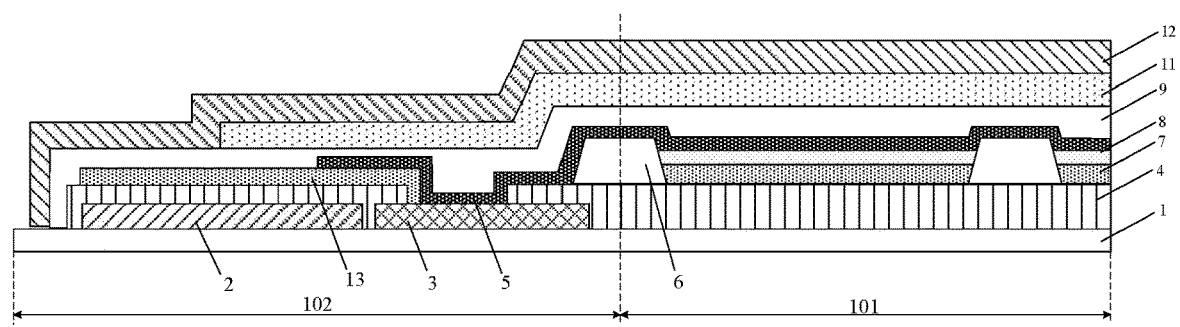

FIG. 6A to FIG. 6B are process schematic diagrams of a manufacturing method of a substrate provided by another embodiment of the present disclosure. The method illustrated in FIG. 6A to FIG. 6B further comprises: forming an electrostatic protective layer. After forming the structure illustrated in FIG. 4G is formed, the electrostatic protective layer 13 and the first electrode 7 are formed simultaneously by a same process. The electrostatic protective layer 13 covers the peripheral circuit 2 and is electrically connected with the common electrode lead 3. An end of the electrostatic protective layer 13 close to the common electrode lead 3 is directly connected with the common electrode lead 3 by a via hole 401 to realize that the electrostatic protective layer 13 is electrically connected with the common electrode lead 3. The electrostatic protective layer 13 conducts the static electricity outside the peripheral circuit 2 by the common electrode lead to prevent the static charge from entering the peripheral circuit 2 and interfering the working state of the peripheral circuit 2. Thus, the electrostatic protective layer 13 and the common electrode lead 3 may be used as a portion of the electrostatic prevention circuit. In the case that the electrostatic prevention circuit needs to be arranged on the substrate 10, the components of the substrate 10 can be simplified. In an embodiment of the present disclosure, the electrostatic protective layer 13 and the first electrode 7 are formed simultaneously by a same process, which is beneficial to simplifying the manufacturing process of the substrate.

By forming the first organic encapsulation layer 9, the inorganic encapsulation layer 11 and the second organic encapsulation layer 12 in the same methods as the methods illustrated in FIG. 4M to FIG. 4O, the substrate illustrated in FIG. 6B is formed.

The substrate, the manufacturing method of the substrate, and, the electronic device are provided by the embodiments of the present disclosure. In at least one embodiment of the present disclosure, the common electrode lead is located on the side of the peripheral circuit close to the working region, which makes the common electrode lead closer to the common electrode, so that the common electrode lead is in direct contact with at least a portion of the common electrode to realize that the common electrode lead is electrically connected with the common electrode. Compared with the case that the common electrode lead is electrically connected with the common electrode by the bridging electrode, on the one hand, the common electrode lead directly contacting the common electrode and being electrically connected with the common electrode reduces the resistance of the circuit which transmits the signal from the common electrode lead to the common electrode, which is conducive to improving the speed of transmitting the signal between the common electrode lead and the common electrode. For example, in the case that the substrate is a light-emitting substrate, such as a display substrate, the brightness uniformity of a display screen becomes better, and thus the display effect becomes better. Moreover, the reduction of the resistance of the circuit is conducive to reducing the power consumption and Joule heat in the working process, a temperature rise caused by the Joule heat is reduced, and thus the life of the device such as the display device including the substrate is prolonged. On the other hand, for the substrate provided by the embodiment of the present disclosure, in the process of forming the common electrode and the common electrode lead by the evaporation method, even if there is a position error of the evaporation mask, a certain size of contacting area between the common electrode and the common electrode lead is able to be ensured. Therefore, there is no need to reserve an excessive distance between the common electrode lead and the dam close to the outer contour edge of the base substrate, which is conducive to realizing the narrow frame. It is also possible to avoid the problem such as an inconsistent dimensional error of the substrate or an inconsistent uniformity of display brightness caused by the position error of the evaporation mask in many production processes.

What is described above is related to only the illustrative embodiments of the present disclosure and not limitative to the scope of the application. The scope of the present application shall be defined by the accompanying claims.

What is claimed is:

1. A substrate, comprising:
   a working region and a non-working region surrounding the working region;
   a base substrate;
   a peripheral circuit and a common electrode lead both in the non-working region and disposed on the base substrate;
   a common electrode;
   wherein the common electrode lead is located on a side of the peripheral circuit close to the working region;
   the common electrode extends from the working region to the non-working region, and the common electrode is in direct contact with at least a portion of the common electrode lead;
   the peripheral circuit is a gate driving circuit, an orthographic projection of the common electrode on the base substrate at least partially overlaps with an orthographic projection of the peripheral circuit on the base substrate, and the orthographic projection of the common electrode on the base substrate, the orthographic projection of the peripheral circuit on the base substrate and an orthographic projection of the common electrode lead on the base substrate do not overlap at the same time.

2. The substrate according to claim 1, wherein the common electrode is a cathode, and the common electrode lead is a cathode lead.

3. The substrate according to claim 1, further comprising a planarization layer covering both the peripheral circuit and the common electrode lead,
   wherein the common electrode is located on a side of the planarization layer away from the base substrate; the planarization layer comprises a via hole that exposes the at least a portion of the common electrode lead, and the common electrode is in direct contact with the common electrode lead at the via hole.

4. The substrate according to claim 3, further comprising an electrostatic protective layer, wherein the electrostatic protective layer is disposed on a side of the planarization layer away from the base substrate and covers at least a portion of the peripheral circuit, and the electrostatic protective layer is electrically connected with the common electrode lead at the via hole.

5. The substrate according to claim 1, further comprising a planarization layer, wherein the common electrode and the common electrode lead are disposed on a side of the planarization layer away from the base substrate, and the common electrode is in direct contact with the at least a portion of the common electrode lead.

6. The substrate according to claim 5, wherein the common electrode directly lies on the at least a portion of the common electrode lead to be in direct contact with the common electrode lead.

7. The substrate according to claim 6, wherein the working region comprises a plurality of working units arranged in an array, and each of the working units comprises:
   a first electrode, disposed on the base substrate;
   a functional layer, disposed on a side of the first electrode away from the base substrate;
   a second electrode, disposed on a side of the functional layer away from the base substrate;
   wherein the second electrode is the common electrode.

8. The substrate according to claim 7, wherein the common electrode lead is disposed in a same layer as the first electrode.

9. The substrate according to claim 5, wherein the common electrode lead directly lies on the at least a portion of the common electrode to be in direct contact with the common electrode.

10. The substrate according to claim 5, wherein an end of the common electrode is abutted with an end of the common electrode lead, and the common electrode is in direct contact with the common electrode lead.

11. The substrate according to claim 5, further comprising an electrostatic protective layer, wherein the electrostatic protective layer is disposed on a side of the planarization layer away from the base substrate and covers at least a portion of the peripheral circuit and is electrically connected with the common electrode lead.

12. The substrate according to claim 11, wherein the electrostatic protective layer directly lies on the at least a portion of the common electrode lead to be in direct contact with the common electrode lead.

13. The substrate according to claim 11, wherein the common electrode lead directly lies on at least a portion of the electrostatic protective layer to be in direct contact with the electrostatic protective layer.

14. The substrate according to claim 11, wherein another end of the common electrode lead is abutted with an end of the electrostatic protective layer, and the common electrode lead is electrically connected with the electrostatic protective layer.

15. An electronic device, comprising the substrate according to claim 1.

16. A method of manufacturing a substrate, wherein the substrate comprises a working region and a non-working region surrounding the working region, and the manufacturing method comprises:
   providing a base substrate;
   forming a peripheral circuit and a common electrode lead both in the non-working region and on the base substrate;
   forming a common electrode;
   wherein the common electrode lead is located on a side of the peripheral circuit close to the working region;
   the common electrode extends from the working region to the non-working region, and the common electrode is in direct contact with at least a portion of the common electrode lead;
   the peripheral circuit is a gate driving circuit, an orthographic projection of the common electrode on the base substrate at least partially overlaps with an orthographic projection of the peripheral circuit on the base substrate, and the orthographic projection of the common electrode on the base substrate, the orthographic projection of the peripheral circuit on the base substrate and an orthographic projection of the common electrode lead on the base substrate do not overlap at the same time.

17. The manufacturing method of the substrate according to claim 16, further comprising: forming a planarization layer,
   wherein the planarization layer covers the peripheral circuit and the common electrode lead; the common electrode is located on a side of the planarization layer away from the base substrate; and the forming the planarization layer comprises: forming a via hole that exposes the at least a portion of the common electrode lead, and the common electrode is in direct contact with the common electrode lead at the via hole.

18. The manufacturing method of the substrate according to claim 16, further comprising: forming a planarization layer,
wherein the common electrode and the common electrode lead are formed on a side of the planarization layer away from the base substrate, and the common electrode is in direct contact with the at least a portion of the common electrode lead.

* * * * *